(12) United States Patent
Bleckmann et al.

(10) Patent No.: US 9,175,983 B2
(45) Date of Patent: Nov. 3, 2015

(54) ROTARY ACTUATOR

(75) Inventors: Michael Bleckmann, Schwerte-Ergste (DE); Uwe Borgmann, Recklinghausen (DE)

(73) Assignee: Leopold Kostal GmbH & Co. KG, Luedenscheid (DE)

(*) Notice: Subject to any disclaimer, the term of this patent is extended or adjusted under 35 U.S.C. 154(b) by 834 days.

(21) Appl. No.: 13/366,719

(22) Filed: Feb. 6, 2012

(65) Prior Publication Data
US 2012/0126640 A1 May 24, 2012

Related U.S. Application Data

(63) Continuation of application No. PCT/EP2010/065740, filed on Oct. 19, 2010.

(30) Foreign Application Priority Data

Oct. 21, 2009 (DE) .......... 10 2009 050 052

(51) Int. Cl.
| | |
|---|---|
| *H01H 19/58* | (2006.01) |
| *G01D 5/241* | (2006.01) |
| *H01H 19/14* | (2006.01) |
| *H01H 25/06* | (2006.01) |
| *H03K 17/96* | (2006.01) |
| *H01H 3/02* | (2006.01) |

(52) U.S. Cl.
CPC ............ *G01D 5/2412* (2013.01); *H01H 19/14* (2013.01); *H01H 25/06* (2013.01); *H03K 17/962* (2013.01); *H01H 2003/0293* (2013.01); *H03K 2217/96031* (2013.01); *H03K 2217/96054* (2013.01); *H03K 2217/960755* (2013.01)

(58) Field of Classification Search
CPC ...................................................... H01H 19/58
USPC ................ 200/417, 564, 11 R, 536, 336, 600
See application file for complete search history.

(56) References Cited

U.S. PATENT DOCUMENTS

| | | | | |
|---|---|---|---|---|
| 4,247,796 A | * | 1/1981 | Fiorentino et al. | 310/308 |
| 5,315,865 A | * | 5/1994 | Hornfeck et al. | 73/114.36 |
| 6,122,944 A | * | 9/2000 | Chandra et al. | 70/388 |

(Continued)

FOREIGN PATENT DOCUMENTS

| | | |
|---|---|---|
| DE | 10065447 A1 | 7/2001 |
| DE | 10120691 A1 | 11/2002 |

(Continued)

OTHER PUBLICATIONS

International Patent Bureau, International Preliminary Report on Patentability for corresponding PCT Application No. PCT/EP2010/065740 issued May 8, 2012.

*Primary Examiner* — Edwin A. Leon
*Assistant Examiner* — Iman Malakooti
(74) *Attorney, Agent, or Firm* — Brooks Kushman P.C.

(57) ABSTRACT

A rotary actuator includes a stator on which a sensor surface is arranged and a rotor configured to rotate about the stator. The rotor forms an actuating surface for the sensor surface. An interval fixing device such as a rotationally fixed sliding disk is arranged between the actuating surface and the sensor surface. A spring is configured to press the sensor surface towards the actuating surface.

18 Claims, 3 Drawing Sheets

(56) References Cited

U.S. PATENT DOCUMENTS

| | | | |
|---|---|---|---|
| 6,339,336 B1 * | 1/2002 | Oisugi et al. | 324/658 |
| 7,060,916 B1 * | 6/2006 | Amit et al. | 200/11 R |
| 7,450,108 B2 | 11/2008 | Clabunde et al. | |
| 2004/0132498 A1 | 7/2004 | Clabunde et al. | |

FOREIGN PATENT DOCUMENTS

| | | |
|---|---|---|
| DE | 10324580 A1 | 12/2004 |
| DE | 102004010406 B3 | 10/2005 |
| EP | 0626705 A2 * | 5/1994 |
| EP | 1870267 A1 | 12/2007 |

* cited by examiner

ROTARY ACTUATOR

CROSS-REFERENCE TO RELATED APPLICATIONS

This application is a continuation of International Application No. PCT/EP2010/065740, published in German, with an international filing date of Oct. 19, 2010, which claims priority to DE 10 2009 050 052.9, filed Oct. 21, 2009, the disclosures of which are incorporated by reference.

TECHNICAL FIELD

The present invention relates to a rotary actuator having a stator and a rotor configured to move rotationally about the stator in which the stator includes a capacitive sensor surface arranged thereon and the rotor forms an actuating surface for the sensor surface.

BACKGROUND

Some rotary actuators have an integrated capacitive sensor system. For example, DE 10 2004 010 406 B3 describes an information and entertainment system having a rotary actuator with an integrated touch sensitive surface. The touch sensitive surface implements a touch screen as an input device for handwriting recognition.

In order to design a touch sensitive surface on a rotary actuator, it is advantageous to arrange the electrical components of the sensor surface on the stator such that the electrical connectors of the components do not restrict the rotational capability of the rotor. The actuating surface itself can be actualized by the outer top surface of the rotor. Tactile contact of the actuating surface of the rotor affects the components of the sensor surface on the stator.

A spacing or interval is necessary between the inner surface of the rotor and the sensor surface on the outer surface of the stator. The spacing minimizes detrimental frictional effects for the stationary sensor surface under the rotatable actuating surface of the rotor.

The properties of touch sensitive capacitive sensors are dependent on the material arrangement between the actuating surface of the rotor, on which a human finger or the like can act, and the sensor surface on the stator. The specific relative permittivity $\epsilon_r$ and thickness of the material is of importance for a precise evaluation of the signal. A large difference exists between the relative permittivity of air ($\epsilon_r=1.0$) and thermoplastic materials ($\epsilon_r=2.5-3.5$) from which the components of the rotational actuator, such as the rotor, are typically made. Due to this property, the thickness of an air gap between the rotor and the sensor surface on the stator disproportionately affects the measured capacitance values.

A difficulty arises in that the relative position and spacing between the actuating surface of the rotor and the sensor surface on the stator cannot be maintained precisely during rotation of the rotor about the stator. Depending on the precision of the pivot bearing of the rotor, different portions of the actuating surface can have different distances to the sensor surface, which also change during rotation of the rotor. The electrical properties of the capacitive sensor are thus dependent on the actuating position and are not constant when the rotary actuator is rotationally activated.

SUMMARY

An object of the present invention includes a rotary actuator in which sensor errors caused by varying distances between a rotating actuating surface and a fixed sensor surface are minimized.

In carrying out at least one of the above and other objects, a rotary actuator is provided. The rotary actuator includes a stator, a rotor, interval fixing means, and a spring. A sensor surface is arranged on the stator. The rotor is configured to rotate about the stator. The rotor forms an actuating surface for the sensor surface. The interval fixing means are arranged between the actuating surface and the sensor surface. The spring is configured to press the sensor surface towards the actuating surface.

Further, in carrying out at least one of the above and other objects, another rotary actuator is provided. This rotary actuator includes a stator, a rotor, a sensor surface, interval fixing means, and a spring. The rotor is configured to rotate about the stator and has an actuating surface. The sensor surface is arranged between the stator and the rotor with the sensor surface and the actuating surface of the rotor spaced apart from one another. The interval fixing means are arranged in the spacing between the actuating surface of the rotor and the sensor surface. The spring is connected to the stator and is configured to press the sensor surface towards the actuating surface of the rotor such that the interval fixing means are enclosed between the actuating surface and the sensor surface whereby the interval fixing means and the spring maintain the spacing between the actuating surface and the sensor surface constant as the rotor rotates about the stator.

Embodiments of the present invention are directed to a rotary actuator having a stator and a rotor. The stator is fixed in position and is thereby stationary relative to the rotor. The rotor is configured to rotate about the stator. The stator includes a sensor surface such as a capacitive sensor surface. The sensor surface is arranged on the stator and is fixed in position. The rotor includes an actuating surface that corresponds to the sensor surface. The portion of the rotor opposite the sensor surface on the stator forms the actuating surface. The rotor and the stator are positioned relative to one another such that the actuating surface of the rotor and the sensor surface on the stator face one another and are separated apart from another. A spacing (i.e., an interval) separate the actuating surface and the sensor surface from one another. The rotary actuator further includes interval fixing means and a spring. The interval fixing means are arranged between the actuating surface and the sensor surface. The spring is configured to press the sensor surface towards the actuating surface.

As described, a rotary actuator in accordance with embodiments of the present invention includes measures (e.g., the interval fixing means and the spring) to maintain the spacing (interval) between the actuating surface of the rotor and the sensor surface on the stator as small as possible and to maintain the size of this spacing as constant as possible.

In an embodiment, the interval fixing means are implemented as a rotationally fixed sliding disk. The disk nearly completely fills the space between the actuating surface of the rotor and the sensor surface on the stator. The material and surface formation of the disk are selected so that the underside of the rotor (which forms part of the actuating surface and is opposite the sensor surface) exerts the lowest possible friction on the disk. The material of the disk is further selected so that the disk has a permittivity matched to the materials of the rotor and the stator.

In an embodiment, the interval fixing means are implemented as pins or bumps on either the actuating surface of the rotor or the sensor surface on the stator. The pins or bumps cooperate with the other of the actuating surface or the sensor surface as an interval maintenance device. The interval maintenance devices likewise fulfill the purpose of allowing a constant and smallest possible spacing between the rotor and stator components (i.e., between the actuating surface of the rotor and the sensor surface on the stator). The frictional forces that arise can be kept small by a suitable surface design of the interval maintenance device.

In either case of the interval fixing means, the spring presses the sensor surface on the stator in the direction towards the actuating surface of the rotor such that the interval fixing means are tightly enclosed between the sensor surface and the actuating surface (i.e., between the sensor surface and the underside of the rotor).

In an embodiment, the spring is a component of an electrical switch. Such an arrangement enables the development of pressure switch functionality of the rotary actuator while maintaining a constant air gap, along with balancing of wobbling motion of the rotor.

The above features, and other features and advantages of the present invention are readily apparent from the following detailed description thereof when taken in connection with the accompanying drawings. It is understood that the features stated above and to be explained below may be used not only in the particular stated combination, but also in other combinations or alone without departing from the scope of the present invention.

Exemplary embodiments of the present invention are illustrated in the drawings and explained in greater detail in the following description. Identical, similar, or functionally equivalent components are denoted by the same reference numerals.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
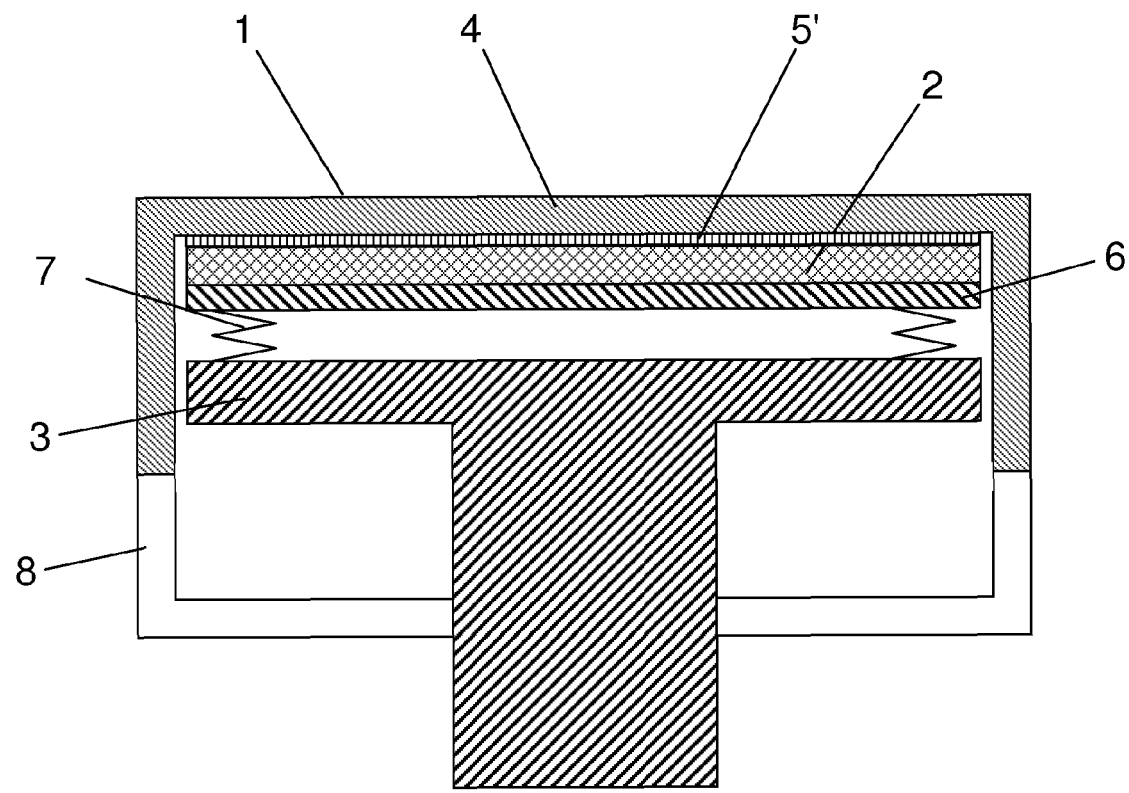
FIG. 1 illustrates a schematic side view of a rotary actuator in accordance with an embodiment of the present invention.
Figure 2:
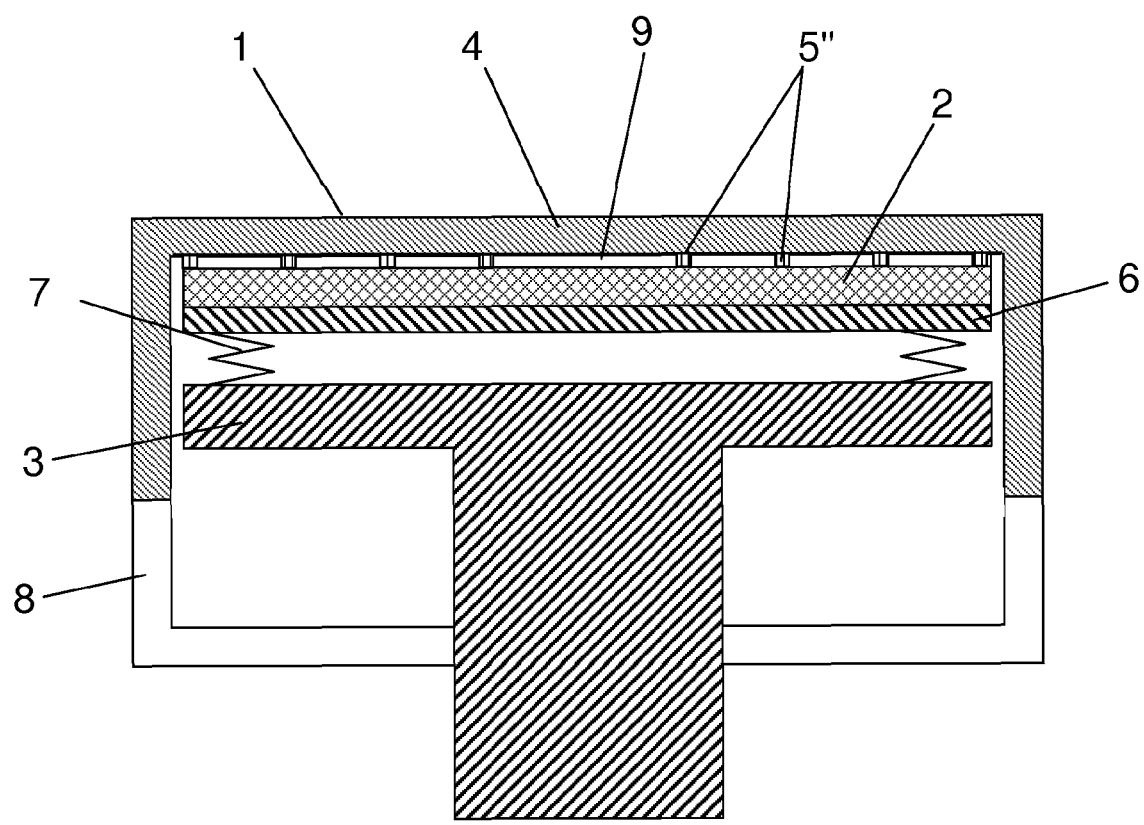
FIG. 2 illustrates a schematic side view of another rotary actuator in accordance with an embodiment of the present invention.

Referring now to FIGS. 1 and 2, schematic side views of a rotary actuator in accordance with embodiments of the present invention are shown. The rotary actuator includes a stator 3 and a rotor 4. Stator 3 is fixed in position and is thereby stationary relative to rotor 4. Stator 3 is formed in the shape of a plunger. Rotor 4 is formed as a hollow cylinder type of rotating wheel and is rotationally mounted on fixed housing components 8 of the rotary actuator about stator 3. Rotor 4 is thereby configured to rotate about stator 3.

Stator 3 includes a sensor surface 2 such as a capacitive sensor surface. Sensor surface 2 is arranged on stator 3 and is fixed in position. Rotor 4 includes an actuating surface 1 that corresponds to sensor surface 2. The outer top surface of rotor 4 forms actuating surface 1. Rotor 4 and stator 3 are positioned relative to one another such that actuating surface 1 of rotor 4 and sensor surface 2 on stator 3 face one another and are separated apart from another. A spacing (i.e., an interval) separate actuating surface 1 and sensor surface 2 from one another.

The rotary actuator further includes interval fixing means 5', 5" and a spring 7. Interval fixing means 5' 5" are arranged between actuating surface 1 of rotor 4 and sensor surface 2 of stator 3. Spring 7 is configured to press sensor surface 2 in the direction towards actuating surface 1. Interval fixing means 5', 5" and spring 7 maintain the spacing (interval) between actuating surface 1 and sensor surface 2 as small as possible and maintain the size of this spacing as constant as possible.

Sensor surface 2 on stator 3 is associated with a support plate 6. Support plate 6 is connected to stator 3 through spring 7. Support plate 6 supports sensor surface 2 thereon.

Sensor surface 2 (shown schematically in FIGS. 1 and 2) is formed by a flat broad conducting structure. The conducting structure is electrically connected to an electronic processing unit (not shown). The conducting structure forms a condenser system which can positionally detect an object approaching actuating surface 1 by changes in the capacitance formed by the surface of rotor 4.

In order to assure that rotor 4 can be rotated against sensor surface 2 without disruptive friction, sensor surface 2 is arranged a certain distance (spacing) from the underside of rotor 4. That is, sensor surface 2 is arranged a certain distance from actuating surface 1 of rotor 4. The distance has to be small and constant over the entire sensor surface 2 and its size has to be maintained during rotation of rotor 4 in order to produce the smallest disturbance to the capacitance measurements. Interval fixing means 5', 5" in conjunction with spring 7 keep the distance between sensor surface 2 and rotor 4 as small and constant as possible in order to fulfill these conditions.

In the embodiment of FIG. 2, the interval fixing means are a plurality of interval maintenance devices 5". Interval maintenance devices 5" are molded onto either sensor surface 2 or the underside of rotor 4 (i.e., actuating surface 1 of rotor 4). Interval maintenance devices 5" have the shape of pins or localized bumps. The shape and surface of interval maintenance devices 5" are configured so that the movable adjacent surface, and thus the underside of rotor 4 or sensor surface 2, can slide along interval maintenance devices 5" with little friction as possible. The vertical extent of interval maintenance device 5" depicted in FIG. 2 is exaggerated in scale, so that the resulting air gap 9 in an actual device is much narrower than shown, and therefore has only a small influence on the electrical properties of the rotary actuator. It is advantageous that air gap 9 is not only narrow, but remains constant to high precision in rotation of rotor 4 with respect to stator 3 during the actuation of the rotary actuator since sensor surface 2 lies tightly against interval maintenance device 5" due to the pressure of spring 7.

In the embodiment of FIG. 1, the interval fixing means is a rotationally fixed sliding disk 5' between sensor surface 2 and the underside of rotor 4. That is, disk 5' is between sensor surface 2 and actuating surface 1 of rotor 4. Disk 5' is a pliable plastic disk or plastic foil with a smooth low friction surface. Disk 5' can also be coated with a lubricant. Disk 5' fills the entire intermediate space between sensor surface 2 and the underside of rotor 4 so that the thickness of the air gap between disk 5' and sensor surface 2 or the underside of rotor 4 is negligible. The permittivity of the material of disk 5' similar to the permittivity of the material from which rotor 4 is made. Disk 5' is only slightly compressible so that it is not pressed together appreciably by any possible wobbling motion of rotor 4 relative to stator 3.

Figure 3:
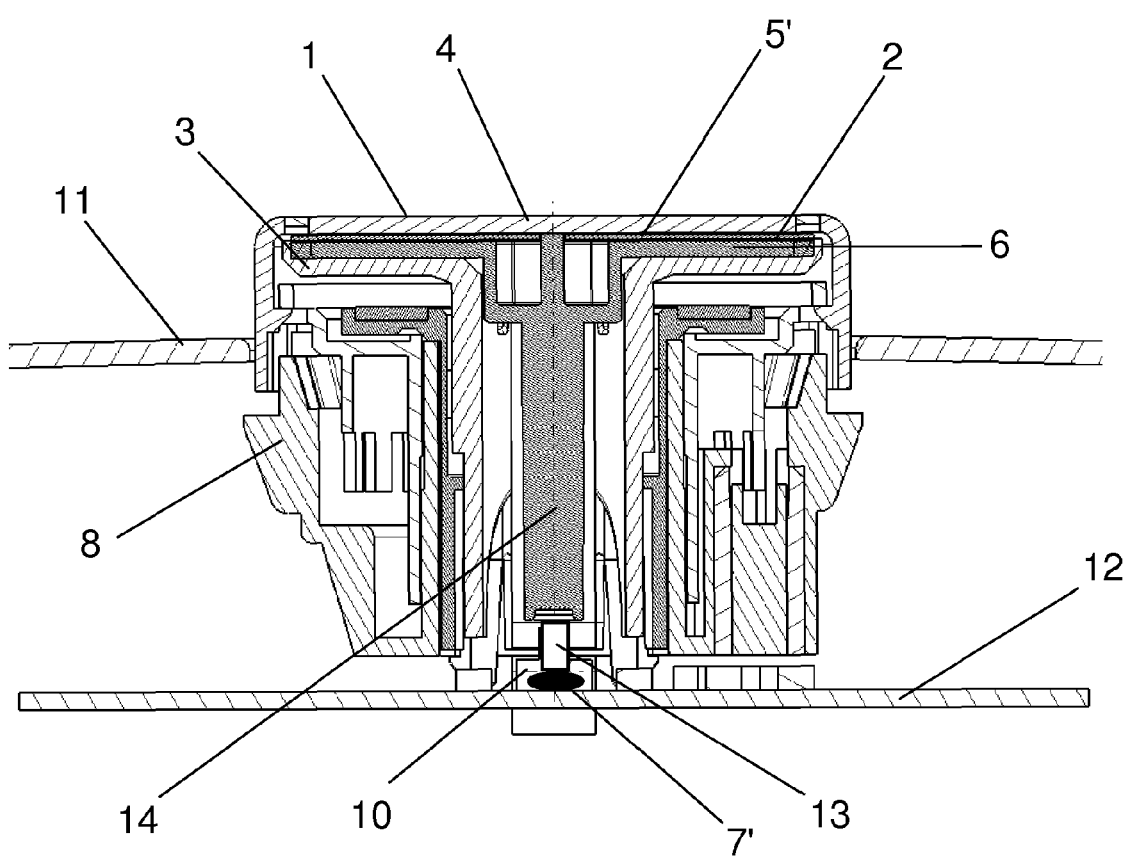
FIG. 3 illustrates a sectional view of an actual design of a rotary actuator in accordance with an embodiment of the present invention.

Referring now to FIG. 3, with continual reference to FIGS. 1 and 2, a sectional view of an actual design of a rotary actuator in accordance with an embodiment of the present invention. The rotary actuator is arranged inside a facia panel 11 and is supported by its underside on a base plate 12. Base plate 12 is formed as a printed circuit board. A pressure switch 10 is electrically connected to printed circuit board 12. Flat-base tappet 13 of pressure switch 10 can be actuated against the restoring force of a spring 7'.

A plunger-shaped section 14 of stator 3 lies on tappet 13. The force of spring 7' acts on stator 3 above plunger-shaped section 14 and tappet 13 and presses a horizontally oriented support plate 6 against disk 5', which in turn lies close against the underside of cap-shaped rotor 4. The force of spring 7' ensures that when rotor 4 is rotationally actuated, almost no intermediate space exists between stator 3 that supports the electric sensor system and rotor 4. In this way, the electrical properties are almost independent of the respective actuation point when actuating surface 1 is touched and does not change when rotor 4 is rotated.

A pressure switching function is created by pressure switch 10, which can be triggered by pressure activation on actuating surface 1. The pressure activation can, for example, be provided for the confirmed triggering of a switching function selected previously by touching actuating surface 1. Since the distance between stator 3 and rotor 4 does not change during pressure activation, the pressure switching function has no negative effect on the quality of the capacitive sensor system.

REFERENCE NUMBERS

1 actuating surface
2 sensor surface
3 stator
4 rotor
(5', 5") interval fixing means
5' sliding disk
5" pins (interval maintenance device)
6 support plate
7,7' spring(s)
8 fixed housing pieces
9 air gap
10 (pressure) switch
11 facia panel
12 base plate (printed circuit board)
13 flat-base tappet
14 plunger shaped section While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A rotary actuator comprising:
a stator on which a sensor surface is arranged;
a rotor configured to rotate about the stator, wherein the rotor has an outer touch-sensitive actuating surface for the sensor surface and an inner surface opposite to the actuating surface, the actuating surface interacting with the sensor surface being exposed to receive tactile contact from a human user onto any portion thereof and being spaced apart from the sensor surface;
interval fixing means entirely arranged between the inner surface of the rotor and the sensor surface; and
a spring configured to press the sensor surface away from the stator in a direction towards the rotor even when the rotor wobbles in a direction away from the stator.

2. The actuator of claim 1 wherein:
the interval fixing means includes a rotationally fixed sliding disk.

3. The actuator of claim 1 wherein:
the interval fixing means includes an interval maintenance device on one of the inner surface of the rotor and the sensor surface.

4. The actuator of claim 3 wherein:
the interval maintenance device includes a plurality of pins or bumps on one of the inner surface of the rotor and the sensor surface.

5. The actuator of claim 1 wherein:
the rotor is movable by pressure applied against the stator and is actuated by the displacement of a switch.

6. The actuator of claim 5 wherein:
the spring is a component of the switch.

7. The actuator of claim 1 wherein:
the sensor surface is a capacitive sensor surface.

8. The actuator of claim 7 wherein:
the permittivity of the interval fixing means matches the permittivity of at least one of the stator and the rotor.

9. A rotary actuator comprising:
a stator;
a sensor surface;
a rotor configured to rotate about the stator, the rotor having an outer touch-sensitive actuating surface for the sensor surface and an inner surface opposite to the actuating surface, the actuating surface interacting with the sensor surface being exposed to receive tactile contact from a human user onto any portion thereof;
the sensor surface arranged between the stator and the rotor with the sensor surface and the inner surface of the rotor spaced apart from one another with a spacing therebetween;
interval fixing means entirely arranged in the spacing between the inner surface of the rotor and the sensor surface; and
a spring connected to the stator and configured to press the sensor surface away from the stator in a direction towards the rotor such that the interval fixing means are enclosed between the inner surface of the rotor and the sensor surface whereby the interval fixing means and the spring maintain the spacing between the inner surface and the sensor surface constant as the rotor rotates about the stator and whenever the rotor wobbles in a direction away from the stator.

10. The actuator of claim 9 wherein:
the interval fixing means includes a rotationally fixed sliding disk.

11. The actuator of claim 9 wherein:
the interval fixing means includes an interval maintenance device on one of the inner surface of the rotor and the sensor surface.

12. The actuator of claim 11 wherein:
the interval maintenance device includes a plurality of pins or bumps on one of the inner surface of the rotor and the sensor surface.

13. The actuator of claim 9 wherein:
the rotor is movable by pressure applied against the stator and is actuated by the displacement of a switch.

14. The actuator of claim 13 wherein:
the spring is a component of the switch.

15. The actuator of claim 9 wherein:
the sensor surface is a capacitive sensor surface.

16. The actuator of claim 15 wherein:
the permittivity of the interval fixing means matches the permittivity of at least one of the stator and the rotor.

17. The actuator of claim 1 wherein:
the stator is plunger-shaped and the rotor is hollow cylindrical-shaped.

18. The actuator of claim 9 wherein:
the stator is plunger-shaped and the rotor is hollow cylindrical-shaped.

* * * * *